US007015740B1

(12) United States Patent
Feinberg et al.

(10) Patent No.: US 7,015,740 B1
(45) Date of Patent: Mar. 21, 2006

(54) SELF-ADJUSTING PROGRAMMABLE ON-CHIP CLOCK ALIGNER

(75) Inventors: Eugene M. Feinberg, Sunnyvale, CA (US); Richard F. Paul, San Jose, CA (US); Philip R. Manela, San Mateo, CA (US)

(73) Assignee: Cisco Technology, Inc., San Jose, CA (US)

( * ) Notice: Subject to any disclaimer, the term of this patent is extended or adjusted under 35 U.S.C. 154(b) by 255 days.

(21) Appl. No.: 10/281,503

(22) Filed: Oct. 28, 2002

(51) Int. Cl.
*H03H 11/26* (2006.01)

(52) U.S. Cl. ........................ 327/270; 327/261; 327/265

(58) Field of Classification Search ................. 327/270, 327/261, 265, 273, 279, 286
See application file for complete search history.

(56) References Cited

U.S. PATENT DOCUMENTS 4,859,970 A * 8/1989 Matsuo et al. ................ 331/57
4,922,141 A * 5/1990 Lofgren et al. ............. 327/158
5,799,049 A 8/1998 McFarland et al. ......... 375/362
5,878,097 A * 3/1999 Hase et al. ................. 375/371
6,229,358 B1 * 5/2001 Boerstler et al. ........... 327/116
6,316,980 B1 * 11/2001 Vogt et al. .................. 327/273
6,581,017 B1 * 6/2003 Zumkehr .................... 327/241
2002/0070783 A1 6/2002 Sacki ......................... 327/235

FOREIGN PATENT DOCUMENTS

EP 1 137 186 A1 9/2001

* cited by examiner

*Primary Examiner*—Dinh T. Le
(74) *Attorney, Agent, or Firm*—Campbell Stephenson Ascolese LLP

(57) ABSTRACT

A circuit including a sensing circuit, which includes a first delay circuit and a tuning circuit. The tuning circuit includes a sense counter and a reference counter. The sense counter is coupled to the first delay circuit and is configured to count a number of oscillations provided by the first delay circuit and provide a notification to the tuning circuit when the sense counter reaches a threshold value. The reference counter is coupled to the sense counter and a reference clock. The reference counter is configured to store a reference time which represents a time elapsed for the sense counter to reach the threshold value. Also included in the circuit is a second delay circuit coupled to the sensing circuit.

42 Claims, 6 Drawing Sheets

SELF-ADJUSTING PROGRAMMABLE ON-CHIP CLOCK ALIGNER

BACKGROUND OF THE INVENTION

1. Field of the Invention

The present invention relates generally to interface circuits, and more specifically, to circuits that provide a programmable time delay substantially unaffected by process, voltage, and temperature variations.

2. Description of the Related Art

Interfacing with many source synchronous circuits (e.g., DRAM memories, and variations thereof) requires precise signal timing. For example, interfacing to DDR DRAM memories requires a clock signal and one or more data signals to be preferably adjusted so that the clock signal arrives at the DDR DRAM memory in the middle of a data valid window.

Traditionally, the time adjustment of clock signals has been accomplished by increasing the length of the clock line on the printed circuit board until the optimal timing is achieved. However, the use of extra wire reduces the quality of the clock signal and consumes already limited space on the printed circuit board. Another traditional method of delaying a signal has been accomplished with a phased lock loop (PLL) circuit. However, in addition to reliability and stability concerns, PLLs commonly require the use of a dedicated constantly running input clock signal, which may not be available, or which may not be cost effective to implement.

The use of on-chip delays, such as a PLL, suffers from another disadvantage in that they are susceptible to operating conditions. The precision by which a signal can be delayed, inside an integrated circuit for example, is limited by environmental and manufacturing conditions. Further, the speed of transistors utilized in integrated circuits depends on manufacturing (process), voltage, and temperature conditions. Because integrated circuits are expected to operate over a range of temperatures and voltages, the transistors themselves are unable to provide a constant delay when environmental conditions vary.

Accordingly, there is the need for a method and apparatus which provides a signal delay which remains substantially constant over process, voltage, and, temperature variations.

SUMMARY OF THE INVENTION

In one embodiment of the present invention, a circuit includes a sensing circuit, which includes a first delay circuit and a tuning circuit. The tuning circuit includes a sense counter and a reference counter. The sense counter is coupled to the first delay circuit and is configured to count a number of oscillations provided by the first delay circuit and provide a notification to the tuning circuit when the sense counter reaches a threshold value. The reference counter is coupled to the sense counter and a reference clock. The reference counter is configured to store a reference time which represents a time elapsed for the sense counter to reach the threshold value. Also included in the circuit is a second delay circuit coupled to the sensing circuit.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features and advantages made apparent to those skilled in the art by referencing the accompanying drawings. The use of the same reference number throughout the figures designates a like or similar element.

DETAILED DESCRIPTION OF THE INVENTION

Introduction

The present invention generally provides a self-adjusting programmable delay circuit that is able to provide a signal delay independent of process, voltage, and temperature (PVT) variations. In one embodiment of the present invention, a sensing circuit and a number of delay elements are provided on an integrated circuit. In response to receiving a programmed delay, the sensing circuit, coupled to a free-running clock, is configured to repeatedly determine a delay element length to satisfy the programmed delay and provide the determined delay element length to the delay circuits. The delay circuits are configured to provide a delayed signal having a delay which also satisfies the programmed delay and which is independent of (i.e., substantially unaffected by) process, temperature, and voltage (PVT) variations.

Embodiments of the present invention provide the ability to program a delay, and also provide a delayed signal having a delay satisfying the programmed delay and substantially unaffected by process, voltage, and temperature (PVT) variations. Additionally, in memory intensive systems, the additional wiring required to delay each of the clocks in such a system can lead to many inefficiencies. For example, the additional wiring complicates the design and manufacturing process and lessens the quality of the signal. Further, the use of extra wiring to delay signals (and other traditional methods of signal delay) is not able to self-compensate for changes in such conditions as temperature and voltage variations, and are also not programmable. By providing a self-adjusting programmable delay circuit in accordance with the present invention, a delay can be provided which is programmable, and is substantially unaffected by changes in PVT. The following sets forth a detailed description of a mode for carrying out the present invention. The description is intended to be illustrative of the invention and should not be taken as limiting.

Structure

Figure 1:
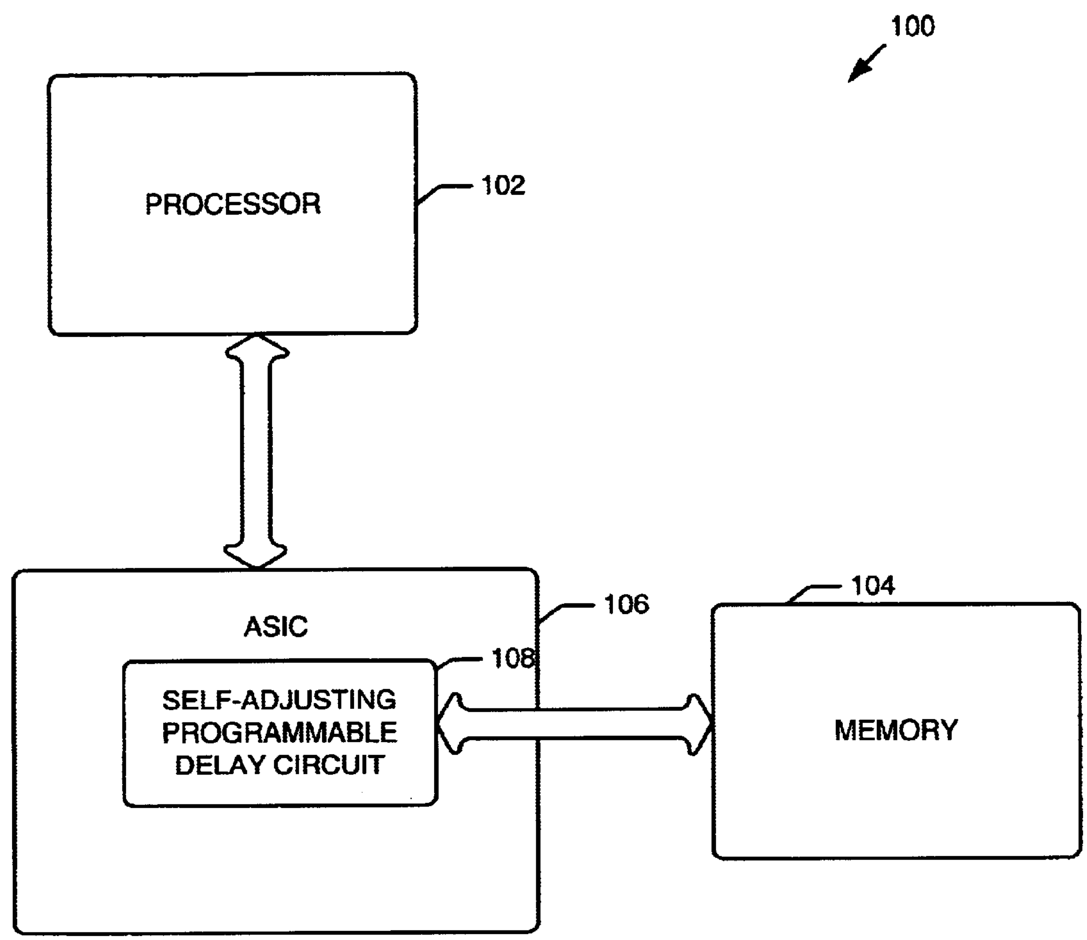
FIG. 1 illustrates a block diagram of a system in accordance with the present invention.

FIG. 1 illustrates a block diagram of a system 100 including a self-adjusting programmable delay circuit in accordance with the present invention. System 100 includes a processor 102 and a memory 104, both coupled to an integrated circuit 106. In one embodiment of the present invention, system 100 is a high end router line card, integrated circuit 104 is an application specific integrated circuit (ASIC), and memory 106 is double data rate memory (DDR) DRAM memory.

As shown, integrated circuit 106 includes a self-adjusting programmable delay circuit 108. In one embodiment of the present invention, self-adjusting programmable delay circuit 108 is a self-adjusting programmable on-chip clock aligner which is capable of receiving a programmed delay and delaying a clock signal by a delay amount, where the delay amount (1) is substantially equal to the programmed delay and (2) is substantially unaffected by process, voltage, and temperature variations.

Figure 2:
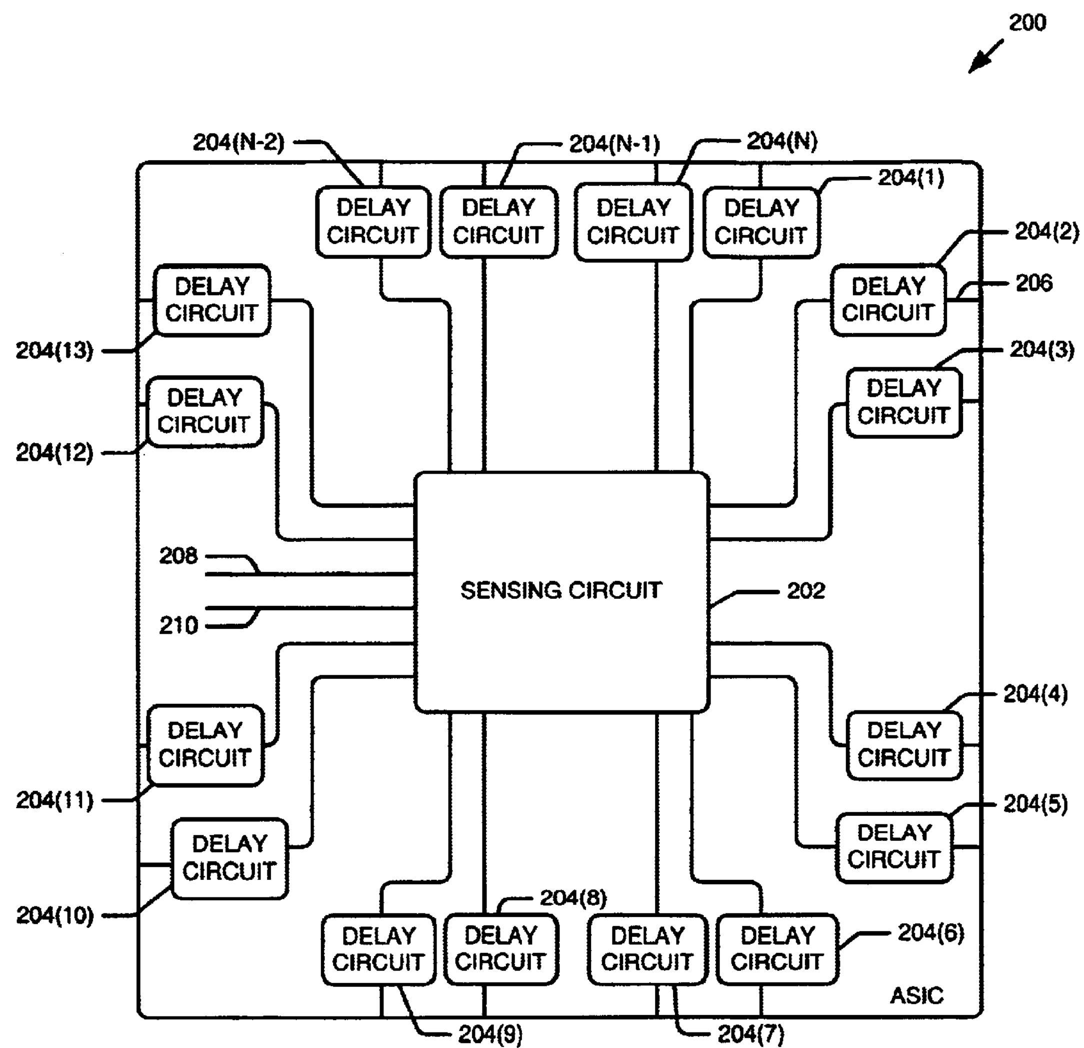
FIG. 2 illustrates a block diagram of one embodiment of the present invention implemented on an application specific integrated circuit (ASIC).

FIG. 2 illustrates a block diagram of an application specific integrated circuit (ASIC) 200 in accordance with one embodiment of the present invention. Application specific integrated circuit 200 includes a sensing circuit 202 coupled to a number of delay circuits 204. In one embodiment of the present invention, ASIC includes 64 delay circuits 204 (i.e., N=64), with each delay circuit 204 being capable of providing a delayed output signal. It is preferable that the temperature gradient of ASIC 200 be such that sensing circuit 202 and each delay circuit 204 are at substantially similar temperatures (i.e., the temperatures of sensing circuit 202 and each delay circuit 204 do not differ by more than a few degrees K). Additionally, it is preferable that sensing circuit 200 and each delay circuit 204 are similarly and carefully processed so as to limit variations in process/manufacturing conditions. Each delay circuit 204 is coupled to an input/output signal path 206.

Sensing circuit 202 is also coupled to a programmed delay signal 208 and a reference clock signal 210. Reference clock signal 210 may be sourced from a clock which is internal or external to ASIC 200. It is preferable that reference clock 210 be a free-running clock source. In operation, sensing circuit 202 receives programmed delay 208 and determines a delay element length necessary to delay signals output on signal paths 206 by programmed delay 208. In accordance with the present invention, the delay provided by each delay circuit 204 is independent of process, temperature, and voltage (PVT) variations experienced by, at least, ASIC 200.

It will be noted that the variable identifier "N" is used in several instances in the figures described herein to more simply designate the final element of a series of related or similar elements. The repeated use of such variable identifiers is not meant to necessarily imply a correlation between the sizes of such series of elements, although such correlation may exist. The use of such variable identifiers does not require that each series of elements has the same number of elements as another series delimited by the same variable identifier. Rather, in each instance of use, the variable identified by "N" (or any other such identifier) may hold the same or a different value than other instances of the same variable identifier.

Moreover, regarding the signals described herein, those skilled in the art will recognize that a signal may be directly transmitted from a first block to a second block, or a signal may be modified (e.g., amplified, attenuated, delayed, latched, buffered, inverted, filtered or otherwise modified) between the blocks. Although the signals of the above described embodiment are characterized as transmitted from one block to the next, other embodiments of the present invention may include modified signals in place of such directly transmitted signals as long as the informational and/or functional aspect of the signal is transmitted between blocks. To some extent, a signal input at a second block may be conceptualized as a second signal derived from a first signal output from a first block due to physical limitations of the circuitry involved. Therefore, as used herein, a second signal derived from a first signal includes the first signal or any modifications to the first signal, whether due to circuit limitations or due to passage through other circuit elements which do not change the informational and/or final functional aspect of the first signal.

The foregoing described embodiment wherein the different components are contained within different other components (for example, ASIC 200). It is to be understood that such depicted architectures are merely examples, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected", or "operably coupled", to each other to achieve the desired functionality.

Figure 3:
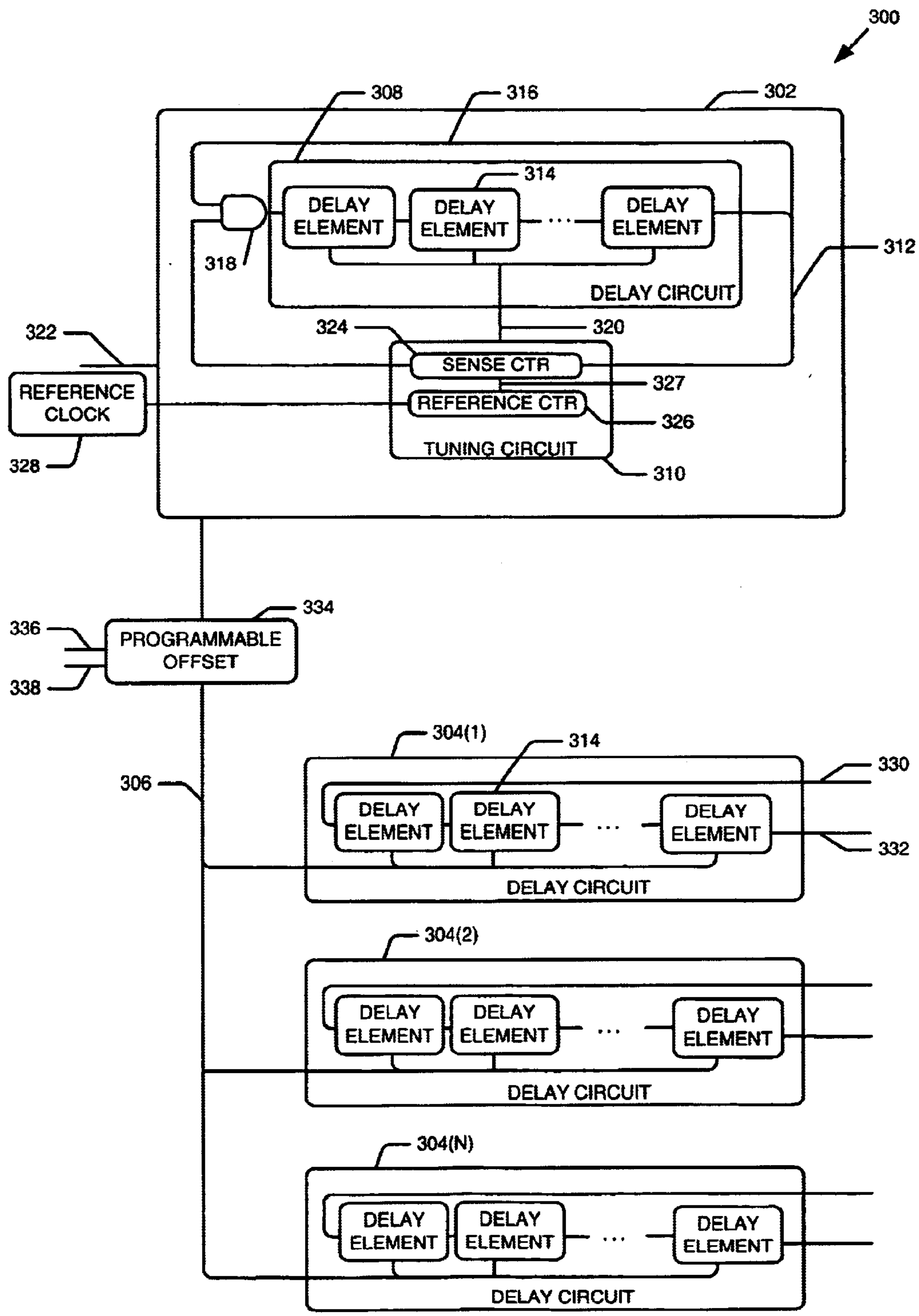
FIG. 3 illustrates a block diagram of a self-adjusting programmable on-chip clock aligner in accordance with the present invention.

FIG. 3 illustrates a block diagram of a self-adjusting programmable delay circuit 300 in accordance with the present invention. Self-adjusting programmable delay circuit 300 includes a sensing circuit 302 coupled to a number of (e.g., 64) delay circuits 304 via a control signal path 306. Sensing circuit 302 includes a sensing delay circuit 308 coupled to a tuning circuit 310 via a signal path 312. Sensing delay circuit 308 includes a number of serially coupled delay elements 314. A feedback line 316 couples a delay element 314 (preferably an end delay element) to AND gate 318. AND gate 318 is configured to compare feedback line 316 to a sense signal (provided on signal path 312) and provide the output of the comparison to sensing delay circuit 308.

A control signal path 320 couples tuning circuit 310 to each delay element 314. Control signal path 320 allows tuning circuit 310 to select the number of delay elements 314 necessary to provide a programmed delay (ie., a target delay) received on input signal 322. Tuning circuit 310 includes a sense counter 324 coupled to sensing delay circuit 308 via signal path 312. Sense counter is also coupled to a reference counter 326 via a signal path 327. In one embodiment of the present invention, sense counter 324 is a saturation counter configured to count to 1024. A reference clock 328, preferably free running, is coupled to reference counter 326.

Referring now to delay circuits 304, each delay circuit 304 includes a number of delay elements 314. A signal path 330 and a delayed signal path 332 are coupled to each delay circuit 304. Signal path 330 receives an input signal and signal path 332 provides a delayed output signal having a delay substantially equal to the target delay received on input signal 322. In one embodiment of the present invention, an optional programmable offset 334 is coupled to sensing circuit 302 and each delay circuit 304 to provide a programmable fine tune delay. Programmable offset 334 is configured to receive a programmable offset signal 336 and an update signal 338. To program a delayed offset, an offset is provided to programmable offset register 334 on signal path 336, and an update signal 338 is triggered at a specified time to update each delay circuit 304 with the desired offset.

Figure 4:
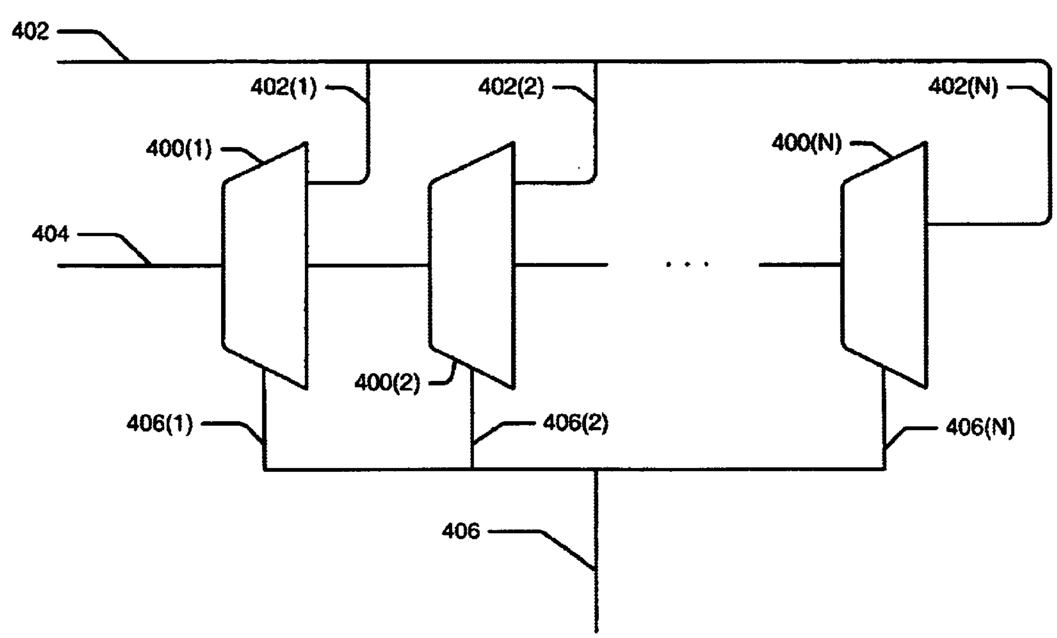
FIG. 4 illustrates a block diagram of delay elements utilized to provide a signal delay according to the present invention.

FIG. 4 illustrates a block diagram of delay elements 400(1,...,N), which are similar to delay elements 314, in accordance with one embodiment of the present invention. Each delay element 400 is configured to receive an input signal 402 and output a delay signal 404. In one embodiment of the present invention, input signal 402 is a clock signal and delay signal 404 is a clock signal having a delay. Delay elements 400(1,...,N) are serially coupled to one another such that the delay of one delay element (e.g., delay element 400(2)) is fed into the following delay element (e.g., delay element 400(1)), thus making the delay of delay signal 404 cumulative. It is preferable that each delay element 400 provide the same amount of delay so that the setting sensed by sensing circuit 302 is accurately provided by delay elements 400. Other embodiments of the present invention are anticipated in which each delay element 400 is configured to provide different delay values.

The delay of delay signal 404 is adjustable by selecting the number of delay elements 400 which contribute to the delay using a control signal 406. Control signal 406, which is provided by a sensing circuit (e.g., sensing circuit 302 of FIG. 3), selects whether a delay element extends the delay chain (e g., the delay element is in forward mode) or whether a given delay element is the end of the delay chain (e.g., the delay clement is in loopback mode). If delay element 400(N) is selected to extend the delay chain, then delay element 400(N) is configured to provide an incremental delay to input signal 402 and transmit the output to the input of the following delay element 400(N-1). However, if delay element 400(N) is selected to be the end of the delay chain, delay element 400(N) is configured to provide an incremental delay to input signal 402 and output the signal from the delay circuit preferably without any additional delays (ie., delay element 400(N) configured for loopback mode is the last delay element in the chain). In one embodiment of the present invention, each delay element 400 is a chainable delay cell including a mux selector to select between forward and loopback mode.

Operation

Figure 5:
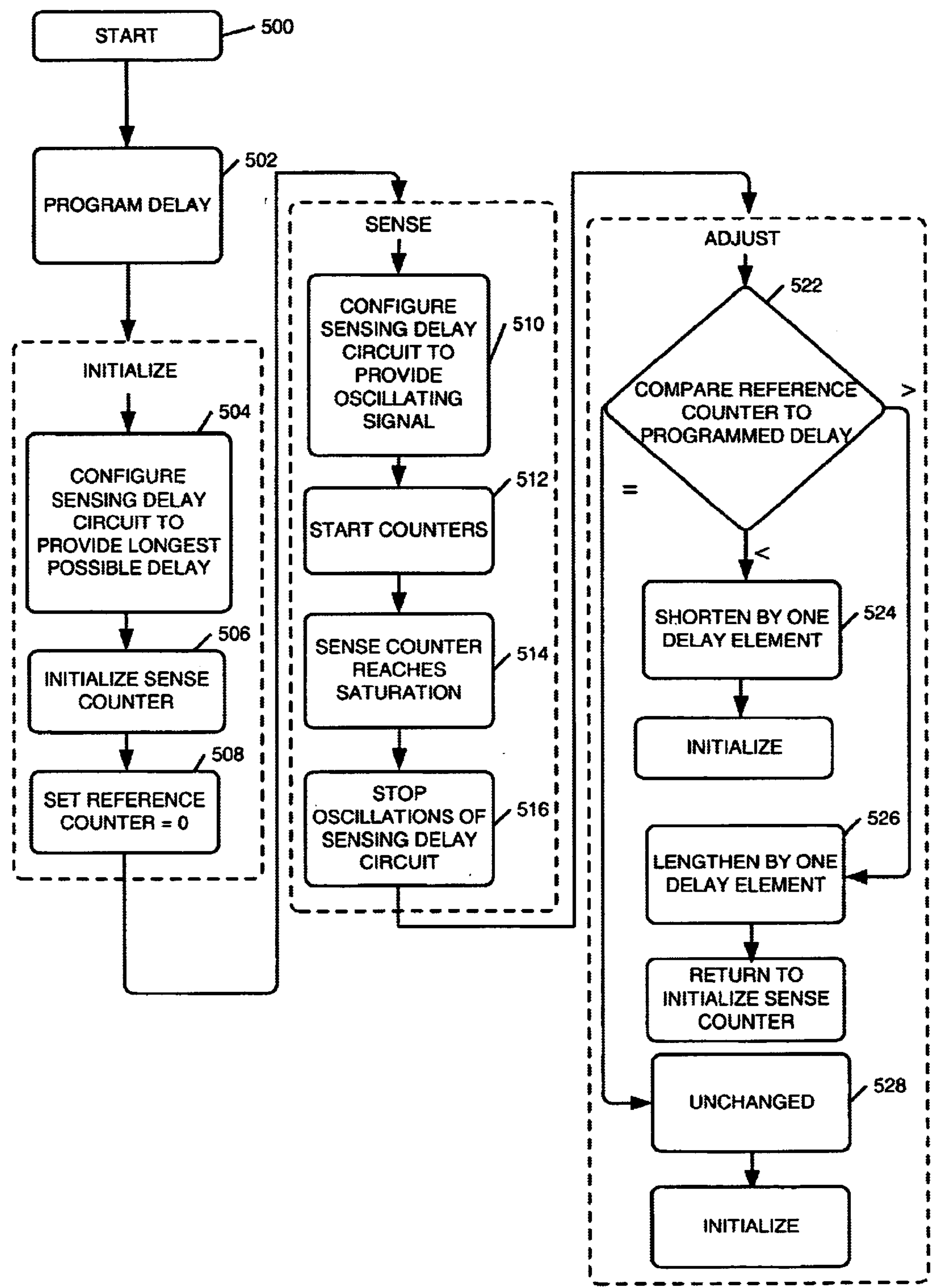
FIG. 5 is a flow diagram illustrating the actions involved in delaying a signal according to the present invention.

FIG. 5 is a flow diagram illustrating the actions involved in delaying a signal according to the present invention. For clarity of description, the actions of FIG. 5 are described with reference to self-adjusting programmable delay circuit 300 of FIG. 3.

Initially, a programmed delay (i.e., a target delay) is provided to sensing circuit 302 on signal path 322 (step 502). The programmed delay is a time delay by which one or more input signals are to be delayed. In one embodiment of the present invention, the programmed delay is provided as a fraction of the period of reference clock 328. For example, if reference clock 328 has a period of 2 nS, and a delay of 1 nS is desired, 0.5 would be provided as the programmed delay.

During an initialization process, tuning circuit 310 sets the delay of sensing delay circuit 308 to provide the longest possible delay. This is accomplished by selecting each delay element 314 except an end delay element to delay the signal provided on signal path 312 (step 504). The end delay element not selected loops the signal on feedback path 316. Sense counter 324 is reset to an initial value (step 506) and reference counter 326 is set to zero (step 508).

During a sensing process, sensing circuit 302 measures the time it takes sense counter 324, driven by delay circuit 308, to reach saturation. Initially in the sensing process, delay circuit 308 is configured as a ring oscillator to generate an oscillating signal (step 510). Next, reference counter 326, which is clocked by reference clock 328 is started, and sense counter 324, which is clocked by the oscillating signal provided by delay circuit 308, is started, preferably simultaneously with reference counter 326 (step 512). Reference counter 326 is configured to "time" (with respect to reference clock 328) the number of oscillations necessary for sense counter 324 to reach saturation. In the present embodiment, two edges of the oscillating signal are required for sense counter 324 to increment, with each increment of sense counter occurring every two "programmed delay" units. When sense counter 324 reaches saturation (step 514), delay circuit 308 stops oscillating (step 516). In one embodiment of the present invention, sense counter 324 reaches saturation after 1024 cycles.

During an adjusting process, sensing circuit adjusts the number of delay elements of delay circuit 308 and delay circuit(s) 304 to provide a delay substantially equal to the programmed delay. The value in reference counter 326, which reflects the time taken by sense counter 324 to reach saturation, is compared to the programmed delay (decision block 522). If the value in reference counter 324 is less than the programmed delay, tuning circuit 310 adjusts the number delay elements of delay circuits 304 and 308 to be one delay element shorter ("LESS THAN" branch of decision block 522, and step 524). In one embodiment of the present invention, this adjustment is accomplished by sending the desired delay element length on control signal path 306 and on control signal path 320. If the number of delay elements is at a minimum length (e.g., one), nothing is done. If, however, the value in reference counter 326 is greater than the programmed delay, tuning circuit 310 adjusts the number of delay elements of delay circuits 304 and 308 to be one delay element longer ("GREATER THAN" branch of decision block 522, and step 526). If the number of delay elements are at a maximum length, then nothing is done. If the reference counter is equal to the program, med delay, the number of delay elements in the delay chain (ie., the delay element length) is left unchanged ("EQUAL" branch of decision block 522, and step 528). After a wait period (step 530), the process is set to repeat at step 506.

It can be seen that by repeating the process continuously, the delay which is output by each delay circuit 304 is continuously adjusted to compensate for any changes in temperature and voltage which may have occurred in between a previous iteration of the process, thus providing a delay which is substantially unaffected by temperature and voltage variations. Additionally, because delay elements 314 of delay circuits 304 and 308 are similarly processed, variations in processing are compensated for as well.

As mentioned above with reference to FIG. 2, it is preferable that the temperature gradient of ASIC 200 be such that sensing circuit 202 and each delay circuit 204 are at substantially similar temperatures (i.e., the temperatures of sensing circuit 202 and each delay circuit 204 do not differ by more than a few degrees K). Additionally, it is preferable that the sensing circuit and each delay circuit contain similarly processed components to limit variations in process/manufacturing conditions. By locating and configuring each delay circuit in this way, and utilizing similarly processed delay elements, and also by repeatedly determining the delay element length necessary to provide the predetermined delay, the delay provided by delay circuits 304 is essentially independent of any process, voltage and temperature variations.

Exemplary System Embodiments

Figure 6:
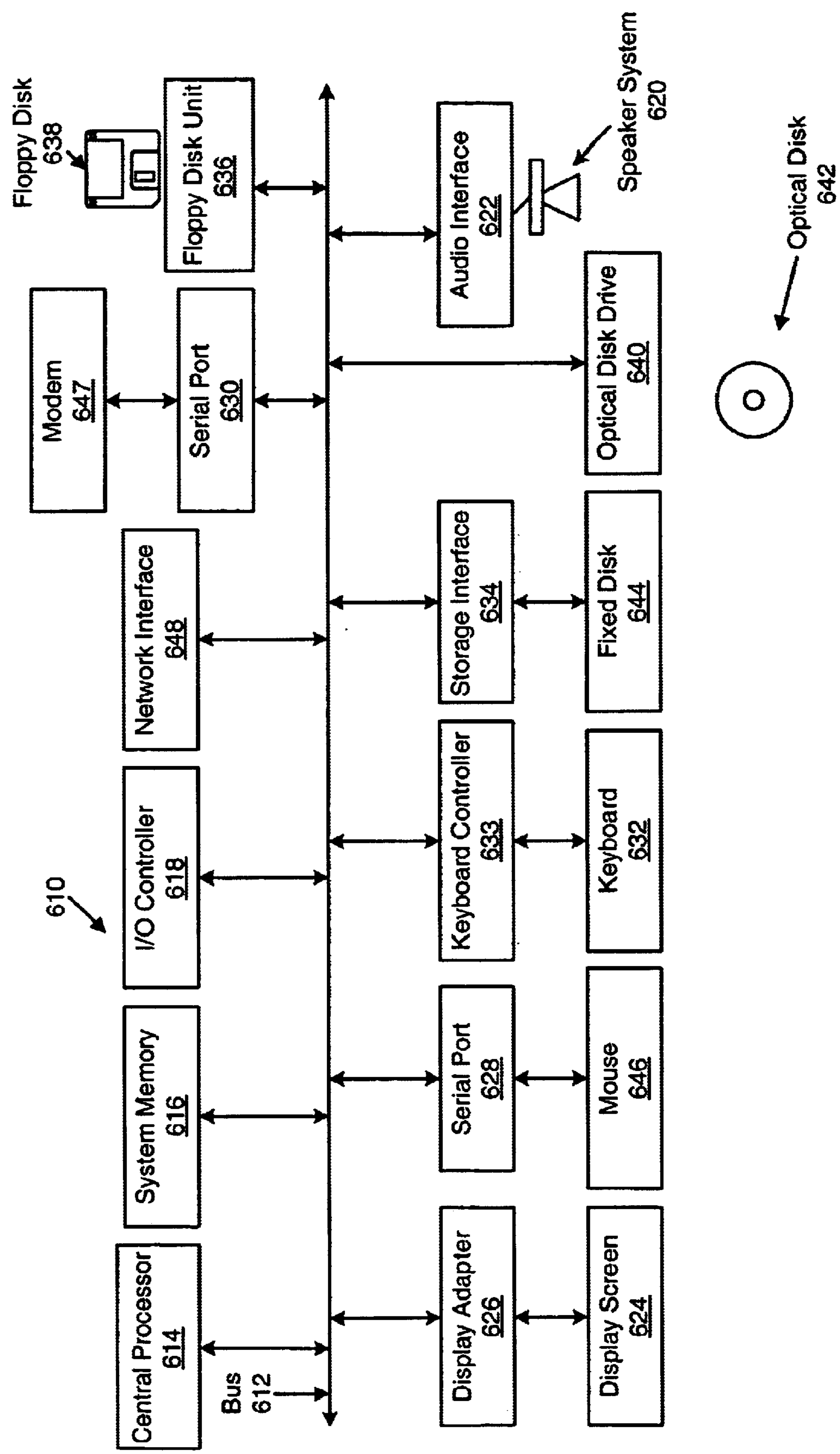
FIG. 6 illustrates a block diagram of an alternative system in which embodiments of the present invention may be implemented.

FIG. 6 depicts a block diagram of a system 610 suitable for implementing the present invention. In one embodiment of the present invention, system 610 is a router configured to route traffic in a networked environment. In another embodiment of the present invention, system 610 is a stand alone computer system. System 610 includes a bus 612 which interconnects major subsystems of system 610 such as a central processor 614, a system memory 616 (typically RAM, but which may also include ROM, flash RAM, or the like), an input/output controller 618, an external audio device such as a speaker system 620 via an audio output interface 622, an external device such as a display screen 624 via display adapter 626, serial ports 628 and 630, a keyboard 632 (interfaced with a keyboard controller 633), a storage interface 634, a floppy disk drive 636 operative to receive a floppy disk 638, and a CD-ROM drive 640 operative to receive a computer readable media 642 (e.g., a CD-ROM). Also included are a mouse 646 (or other point-and-click device, coupled to bus 612 via serial port 628), a modem 647 (coupled to bus 612 via serial port 630) and a network interface 648 (coupled directly to bus 612).

Bus 612 allows data communication between central processor 614 and system memory 616, which may include both read only memory (ROM) or flash memory (neither shown), and random access memory (RAM) (not shown), as previously noted. The RAM is generally the main memory into which the operating system and application programs are loaded and typically affords at least 66 megabytes of memory space. The ROM or flash memory may contain, among other code, the Basic Input-Output system (BIOS) which controls basic hardware operation such as the interaction with peripheral components. Applications resident with system 610 are generally stored on and accessed via a computer readable medium, such as a hard disk drive (e.g., fixed disk 644), an optical drive (e.g., CD-ROM drive 640),floppy disk unit 636 or other storage medium. Additionally, applications may be in the form of electronic signals modulated in accordance with the application and data communication technology when accessed via network modem 647 or interface 648.

Storage interface 634, as with the other storage interfaces of system 610, may connect to a standard computer readable medium for storage and/or retrieval of information, such as a fixed disk drive 644. Fixed disk drive 644 may be a part of system 610 or maybe separate and accessed through other interface systems. Many other devices can be connected such as a mouse 646 connected to bus 612 via serial port 628, a modem 647 connected to bus 612 via serial port 630 and a network interface 648 connected directly to bus 612. Modem 647 may provide a direct connection to a remote server via a telephone link or to the Internet via an internet service provider (ISP). Network interface 648 may provide a direct connection to a remote server via a direct network link to the Internet via a POP (point of presence). Network interface 648 may provide such connection using wireless techniques, including digital cellular telephone connection, Cellular Digital Packet Data (CDPD) connection, digital satellite data connection or the like.

Many other devices or subsystems (not shown) may be connected in a similar manner (e.g., bar code readers, document scanners, digital cameras and so on). Conversely, it is not necessary for all of the devices shown in FIG. 6 to be present to practice the present invention. The devices and subsystems may be interconnected in different ways from that shown in FIG. 6. The operation of a system such as that shown in FIG. 6 is readily known in the art and is not discussed in detail in this application. Code to implement the present invention may be stored in computer-readable storage media such as one or more of system memory 616, fixed disk 644, CD-ROM 642, or floppy disk 638.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims.

What is claimed is:

1. A circuit comprising:

a sensing circuit comprising a first delay circuit for delaying an input signal and a tuning circuit, wherein said tuning circuit comprises, a sense counter coupled to said first delay circuit, said sense counter configured to count a number of oscillations of a delayed signal provided by said first delay circuit and provide a signal to said tuning circuit when said sense counter reaches a threshold value; and a second delay circuit coupled to said sensing circuit to receive a control signal from said sensing circuit, wherein the second delay circuit comprises substantially the same structure as the first delay circuit.

2. The circuit of claim 1, wherein said tuning circuit further comprises:

a reference counter coupled to said sense counter, wherein said reference counter is driven by a reference clock, and said reference counter is configured to store a value which represents a time elapsed for said sense counter to reach said threshold value.

3. The circuit of claim 2, wherein:

said sensing circuit is configured to receive a target delay and repeatedly determine a delay element length that provides a delay substantially equal to said target delay; and said second delay circuit is configured to receive said delay element length and provide a delay substantially equal to said target delay, said delay being substantially constant.

4. The circuit of claim 3, wherein said delay substantially equal to said target delay is substantially unaffected by at least one of process changes, temperature changes, and voltage changes experienced by said circuit.

5. The circuit of claim 2, wherein said tuning circuit is configured to compare said value to said target delay and determine a delay element length for said first and second delay circuits to provide a delay substantially equal to said target delay.

6. The circuit of claim 5, wherein:

said tuning circuit is configured to increase said delay element length in response to a determination that said value is less than said target delay; and said tuning circuit is configured to decrease said delay element length in response to a determination that said value is greater than said target delay.

7. The circuit of claim 2, wherein said first delay circuit comprises:

a plurality of delay elements;

a signal input path;

a delayed signal output path; and a feedback path, wherein each of said signal input path, said delayed signal output path, and said feedback path are coupled to at least one of said plurality of delay elements.

8. The circuit of claim 7, wherein each of said plurality of delay elements comprises:

a signal path;

an incremental delayed signal path; and a selector coupled to each of said signal path and said incremental delayed signal path to select between said signal path and said incremental delayed signal path.

9. The circuit of claim 7, wherein each of said plurality of delay elements is configured to provide a fixed delay.

10. The circuit of claim 7, wherein said plurality of delay elements are serially connected with both a first and a last delay element coupled to said sense counter.

11. The circuit of claim 2, wherein said first delay circuit is configured as a ring oscillator.

12. The circuit of claim 2, wherein said second delay circuit comprises:

an input signal path;

a delayed output signal path; and a plurality of delay elements, wherein each of said plurality of delay elements is configured to provide a fixed signal delay and each of said input signal path and said delayed output signal path is coupled to at least one of said plurality of delay elements.

13. The circuit of claim 12, wherein each of said plurality of delay elements comprises:

a signal path;

an incremental delayed signal path; and a selector coupled to each of said signal path and said incremental delayed signal path to select said signal path or said incremental delayed signal path.

14. The circuit of claim 12, wherein said second delay circuit is one of a plurality of delay circuits.

15. The circuit of claim of claim 2, wherein a temperature gradient of the circuit is such that said sensing circuit and said first and second delay circuits are configured to operate at substantially similar temperatures.

16. A method comprising:

determining a delay element length of a first delay circuit to enable a sense counter, to reach a threshold value within a target delay, wherein the delay element length is a number of a plurality of delay elements that comprise the first delay ciruit, and the sense counter is coupled to the first delay circuit and configured to count a number of oscillations of a delayed signal provided by t the first delay circuit; and providing said delay element length to a second delay circuit, whrein the second delay circuit comprises substantially the same structure as the first delay circuit.

17. The method of claim 16, further comprising:

providing a delayed signal via said second delay circuit, said delayed signal having a delay substantially equal to said target delay.

18. The method of claim 17, wherein said determining comprises:

measuring a reference time, said reference time equal to the time it takes said sense counter to reach said threshold value; and adjusting said delay element length of said first delay circuit so that the time it takes said sense counter to reach said threshold value is substantially equal to said target delay.

19. The method of claim 18, wherein said measuring comprises:

driving a reference counter with a reference clock; and providing said reference time by stopping said reference counter when said sense counter reaches saturation.

20. The method of claim 19, wherein said adjusting comprises:

comparing said target delay to said reference time;

if said reference time is less than said target delay, increasing said delay element length; and if said reference time is greater than said target delay, decreasing said delay element length.

21. The method of claim 19, further comprising:

programming said target delay.

22. A system comprising:

a processor;

a sensing circuit, comprising a first delay circuit for delaying an input signal and a tuning circuit, wherein said tuning circuit comprises:

a sense counter coupled to said first delay circuit, said sense counter configured to count a number of oscillations of a delayed signal provided by said first delay circuit and provide a signal to said tuning circuit when said sense counter reaches a threshold value; and a second delay circuit coupled to said sensing circuit, wherein said processor is coupled to at least one of said sensing circuit and said second delay circuit and configured to receive a control signal from said sensing circuit, and said processor is coupled to at least one of said sensing circuit and said second delay circuit.

23. The system of claim 22, wherein said tuning circuit further comprises:

a reference counter coupled to said sense counter, wherein said reference counter is driven by a reference clock, and said reference counter is configured to store a reference time which represents a time elapsed for said sense counter to reach said threshold value.

24. The system of claim 23, wherein:

said sensing circuit is configured to receive a target delay and repeatedly determine a delay element length that provides a delay substantially equal to said target delay; and said second delay circuit is configured to receive said delay element length and provide a delay substantially equal to said target delay, said delay being substantially constant.

25. The system of claim 24, wherein said delay is substantially unaffected by at least one of process changes, temperature changes, and voltage changes experienced by said circuit.

26. The system of claim 23, wherein said tuning circuit is configured to compare said reference time to said target delay and determine a delay element length for said first and second delay circuits to provide a delay substantially equal to said target delay.

27. The system of claim 26, wherein:

if said reference time is less than said target delay, said tuning circuit is configured to increase said delay element length; and if said reference time is greater than said target delay, said tuning circuit is configured to decrease said delay element length.

28. The system of claim 27, wherein said first delay circuit comprises:

a plurality of delay elements;

a signal input path;

a delayed signal output path; and a feedback path.

29. The system of claim 28, wherein each delay element comprises:

a signal path;

an incremental delayed signal path; and a select signal to select between said signal path and said delayed signal path.

30. The system of claim 28, wherein each delay element configured to provide a fixed delay.

31. The system of claim 28, wherein said plurality of delay elements are serially connected with both a first and a last delay element coupled to said sense counter.

32. The system of claim 23, wherein said first delay circuit is configured as a ring oscillator.

33. The system of claim 23, wherein said second delay circuit comprises:

an input signal path;

a delayed output signal path; and a plurality of delay elements, each delay element is configured to provide a fixed signal delay.

34. The system of claim 33, wherein each delay element comprises:

a signal path;

an incremental delayed signal path; and a select signal to select said signal path or said delayed signal path.

35. The system of claim 33, wherein said second delay circuit is one of a plurality of delay circuits.

36. The system of claim of claim 23, wherein the temperature gradient of the circuit is such said sensing circuit and said first and second delay circuits are configured to operate at substantially similar temperatures.

37. A circuit comprising:

means for determining a delay element length of a first delay circuit to enable a sense counter, to reach a threshold value within a target delay circuit, and the sense counter is coupled to the first delay circuit and configured to count a number of oscillations of a delayed signal provided by the first delay circuit; and means for providing said delay element length to a second delay circuit, wherein the second delay circuit comprises substantially the same structure as the first delay circuit.

38. The circuit of claim 37, further comprising:

means for providing a delayed signal, said delayed signal having a delay substantially equal to said target delay.

39. The circuit of claim 38, wherein said determining comprises:

means for measuring a reference time, said reference time equal to the time it takes said sense counter to reach said threshold value; and means for adjusting said delay element length of said first delay circuit so that the time it takes said sense counter to reach said threshold value is substantially equal to said target delay.

40. The circuit of claim 39, wherein said measuring comprises:

means for providing said reference time.

41. The circuit of claim 39, wherein said adjusting comprises:

means for comparing said target delay to said reference time;

if said reference time is less than said target delay, means for increasing said delay element length; and if said reference time is greater than said target delay, means for decreasing said delay element length.

42. The circuit of claim 39, further comprising:

means for programming said target delay.

* * * * *